(12) United States Patent  (10) Patent No.: US 8,680,441 B2
Singh  (45) Date of Patent: Mar. 25, 2014

(54) HEATING PLATE WITH PLANAR HEATER ZONES FOR SEMICONDUCTOR PROCESSING

(71) Applicant: Lam Research Corporation, Fremont, CA (US)

(72) Inventor: Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/013,447

(22) Filed: Aug. 29, 2013

(65) Prior Publication Data

US 2014/0004702 A1    Jan. 2, 2014

Related U.S. Application Data

(62) Division of application No. 12/943,492, filed on Nov. 10, 2010, now Pat. No. 8,546,732.

(51) Int. Cl.
*H05B 3/26* (2006.01)
*F27B 5/14* (2006.01)
*F27D 11/02* (2006.01)
*H01L 23/28* (2006.01)
*H01L 23/52* (2006.01)

(52) U.S. Cl.
USPC ........ 219/486; 219/444.1; 219/539; 219/541; 118/725; 118/728

(58) Field of Classification Search
None
See application file for complete search history.

(56) References Cited

U.S. PATENT DOCUMENTS

| 3,440,883 A | 4/1969 | Lightner |
| 5,059,770 A | 10/1991 | Mahawili |
| 5,255,520 A | 10/1993 | O'Geary et al. |
| 5,414,245 A | 5/1995 | Hackleman |
| 5,504,471 A | 4/1996 | Lund |
| 5,515,683 A | 5/1996 | Kessler |
| 5,536,918 A | 7/1996 | Ohkase et al. |
| 5,635,093 A | 6/1997 | Arena et al. |
| 5,665,166 A | 9/1997 | Deguchi et al. |

(Continued)

FOREIGN PATENT DOCUMENTS

| JP | 2005-123286 A | 5/2005 |
| JP | 2005-294237 A | 10/2005 |
| KR | 2008-0058109 A | 6/2008 |

OTHER PUBLICATIONS

Ayars, Eric, "Bandgap in a Semiconductor Diode", Advanced and Intermediate Instructional Labs Workshop, AAPT Summer Meeting, California State University, Chicago, Jul. 20, 2008 http://phys.csuchico.edu/-eayars/publications/bandgap.pdf.

(Continued)

*Primary Examiner* — Joseph M Pelham
(74) *Attorney, Agent, or Firm* — Buchanan Ingersoll & Rooney PC

(57) ABSTRACT

A heating plate for a substrate support assembly in a semiconductor plasma processing apparatus, comprises multiple independently controllable planar heater zones arranged in a scalable multiplexing layout, and electronics to independently control and power the planar heater zones. Each planar heater zone includes one or more heater element made of an insulator-conductor composite. A substrate support assembly in which the heating plate is incorporated includes an electrostatic clamping electrode and a temperature controlled base plate. Methods for manufacturing the heating plate include bonding together ceramic having planar heater zones, power supply lines, power return lines and vias.

14 Claims, 4 Drawing Sheets

(56) References Cited

U.S. PATENT DOCUMENTS

| | | |
|---|---|---|
| 5,667,622 A | 9/1997 | Hasegawa et al. |
| 5,740,016 A | 4/1998 | Dhindsa |
| 5,802,856 A | 9/1998 | Schaper et al. |
| 5,851,298 A | 12/1998 | Ishii |
| 5,886,866 A | 3/1999 | Hausmann |
| 6,060,697 A | 5/2000 | Morita et al. |
| 6,095,084 A | 8/2000 | Shamouilian et al. |
| 6,100,506 A | 8/2000 | Colelli, Jr. et al. |
| 6,169,275 B1 | 1/2001 | Noda et al. |
| 6,175,175 B1 | 1/2001 | Hull |
| 6,222,161 B1 | 4/2001 | Shirakawa et al. |
| 6,271,459 B1 | 8/2001 | Yoo |
| 6,353,209 B1 | 3/2002 | Schaper et al. |
| 6,403,403 B1 | 6/2002 | Mayer et al. |
| 6,469,283 B1 * | 10/2002 | Burkhart et al. ............... 219/486 |
| 6,475,336 B1 | 11/2002 | Hubacek |
| 6,483,690 B1 | 11/2002 | Nakajima et al. |
| 6,512,207 B1 | 1/2003 | Dress et al. |
| 6,523,493 B1 | 2/2003 | Brcka |
| 6,566,632 B1 | 5/2003 | Katata et al. |
| 6,612,673 B1 | 9/2003 | Giere et al. |
| 6,664,515 B2 | 12/2003 | Natsuhara et al. |
| 6,739,138 B2 | 5/2004 | Saunders et al. |
| 6,740,853 B1 | 5/2004 | Johnson et al. |
| 6,741,446 B2 | 5/2004 | Ennis |
| 6,746,616 B1 | 6/2004 | Fulford et al. |
| 6,795,292 B2 | 9/2004 | Grimard et al. |
| 6,815,365 B2 | 11/2004 | Masuda et al. |
| 6,825,617 B2 | 11/2004 | Kanno et al. |
| 6,825,681 B2 | 11/2004 | Feder et al. |
| 6,835,290 B2 | 12/2004 | Reiter et al. |
| 6,847,014 B1 | 1/2005 | Benjamin et al. |
| 6,870,728 B1 | 3/2005 | Burket et al. |
| 6,886,347 B2 | 5/2005 | Hudson et al. |
| 6,921,724 B2 | 7/2005 | Kamp et al. |
| 6,979,805 B2 | 12/2005 | Arthur et al. |
| 6,985,000 B2 | 1/2006 | Feder et al. |
| 6,989,210 B2 | 1/2006 | Gore |
| 7,075,031 B2 | 7/2006 | Strang et al. |
| 7,141,763 B2 | 11/2006 | Moroz |
| 7,173,222 B2 | 2/2007 | Cox et al. |
| 7,175,714 B2 | 2/2007 | Ootsuka et al. |
| 7,206,184 B2 | 4/2007 | Ennis |
| 7,230,204 B2 | 6/2007 | Mitrovic et al. |
| 7,250,309 B2 | 7/2007 | Mak et al. |
| 7,268,322 B2 | 9/2007 | Kuibira et al. |
| 7,274,004 B2 | 9/2007 | Benjamin et al. |
| 7,275,309 B2 | 10/2007 | Matsuda et al. |
| 7,279,661 B2 | 10/2007 | Okajima et al. |
| 7,297,894 B1 | 11/2007 | Tsukamoto |
| 7,311,782 B2 | 12/2007 | Strang et al. |
| 7,372,001 B2 | 5/2008 | Tachikawa et al. |
| 7,396,431 B2 | 7/2008 | Chen et al. |
| 7,415,312 B2 * | 8/2008 | Barnett et al. ............... 700/29 |
| 7,417,206 B2 * | 8/2008 | Nakamura ............... 219/444.1 |
| 7,475,551 B2 | 1/2009 | Ghoshal |
| 7,480,129 B2 | 1/2009 | Brown et al. |
| 7,504,006 B2 | 3/2009 | Gopalraja et al. |
| 7,586,734 B2 | 9/2009 | Kamitani et al. |
| 7,718,932 B2 | 5/2010 | Steger |
| 7,782,583 B2 | 8/2010 | Moon |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 8,057,602 B2 | 11/2011 | Koelmel et al. |
| 8,092,602 B2 | 1/2012 | Fink et al. |
| 8,136,820 B2 | 3/2012 | Morioka et al. |
| 8,168,050 B2 | 5/2012 | Lu |
| 8,207,476 B2 | 6/2012 | Tsukamoto et al. |
| 8,222,574 B2 | 7/2012 | Sorabji et al. |
| 8,441,764 B2 | 5/2013 | Blakes |
| 8,461,674 B2 | 6/2013 | Gaff et al. |
| 8,546,732 B2 | 10/2013 | Singh |
| 2002/0043528 A1 | 4/2002 | Ito |
| 2004/0222210 A1 * | 11/2004 | Lin et al. ............... 219/444.1 |
| 2005/0016465 A1 | 1/2005 | Ramaswamy et al. |
| 2005/0215073 A1 | 9/2005 | Nakamura et al. |
| 2005/0229854 A1 | 10/2005 | Moroz |
| 2006/0191637 A1 | 8/2006 | Zajac et al. |
| 2006/0226123 A1 | 10/2006 | Birang |
| 2007/0056953 A1 * | 3/2007 | Awazu et al. ............... 219/444.1 |
| 2007/0062929 A1 * | 3/2007 | Mikumo et al. ............ 219/444.1 |
| 2007/0125762 A1 | 6/2007 | Cui et al. |
| 2007/0138161 A1 * | 6/2007 | Yamakawa ............... 219/444.1 |
| 2008/0092818 A1 * | 4/2008 | Fink et al. ............... 118/724 |
| 2008/0202924 A1 | 8/2008 | Bluck et al. |
| 2009/0000738 A1 | 1/2009 | Benjamin |
| 2009/0031955 A1 * | 2/2009 | Lu et al. ............... 118/728 |
| 2009/0173445 A1 | 7/2009 | Yeom et al. |
| 2009/0183677 A1 | 7/2009 | Tian et al. |
| 2009/0215201 A1 | 8/2009 | Benjamin et al. |
| 2009/0284894 A1 | 11/2009 | Cooke |
| 2010/0044364 A1 * | 2/2010 | Mikumo et al. ............ 219/444.1 |
| 2010/0055881 A1 * | 3/2010 | Shimizu ............... 438/478 |
| 2010/0116788 A1 | 5/2010 | Singh et al. |
| 2010/0257871 A1 | 10/2010 | Venkatasubramanian et al. |
| 2011/0005682 A1 | 1/2011 | Savas et al. |
| 2011/0033175 A1 | 2/2011 | Kasai et al. |
| 2011/0092072 A1 | 4/2011 | Singh et al. |
| 2011/0108706 A1 | 5/2011 | Koyama |
| 2011/0143462 A1 | 6/2011 | Gaff et al. |
| 2012/0097661 A1 | 4/2012 | Singh |
| 2013/0068750 A1 * | 3/2013 | Gaff et al. ............... 219/444.1 |
| 2013/0072025 A1 | 3/2013 | Singh et al. |

OTHER PUBLICATIONS

International Search Report mailed Feb. 22, 2012 for PCT/US2011/058590.

* cited by examiner

HEATING PLATE WITH PLANAR HEATER ZONES FOR SEMICONDUCTOR PROCESSING

BACKGROUND

With each successive semiconductor technology generation, substrate diameters tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non plasma applications such as electron beam deposition, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. One metric for plasma processing systems is increased uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self diagnostics.

SUMMARY

Described herein is a heating plate for a substrate support assembly used to support a semiconductor substrate in a semiconductor processing apparatus, the heating plate comprising: an electrically insulating layer; planar heater zones comprising at least first, second, third and fourth planar heater zones, each comprising one or more heater element made of an insulator-conductor composite, the planar heater zones laterally distributed across the electrically insulating layer and operable to tune a spatial temperature profile on the semiconductor substrate; power supply lines comprising at least a first electrically conductive power supply line electrically connected to the first and second planar heater zones and a second electrically conductive power supply line electrically connected to the third and fourth planar heater zones; power return lines comprising at least a first electrically conductive power return line electrically connected to the first and third planar heater zones and a second electrically conductive power return line electrically connected to the second and fourth planar heater zones.

DETAILED DESCRIPTION

Figure 1:
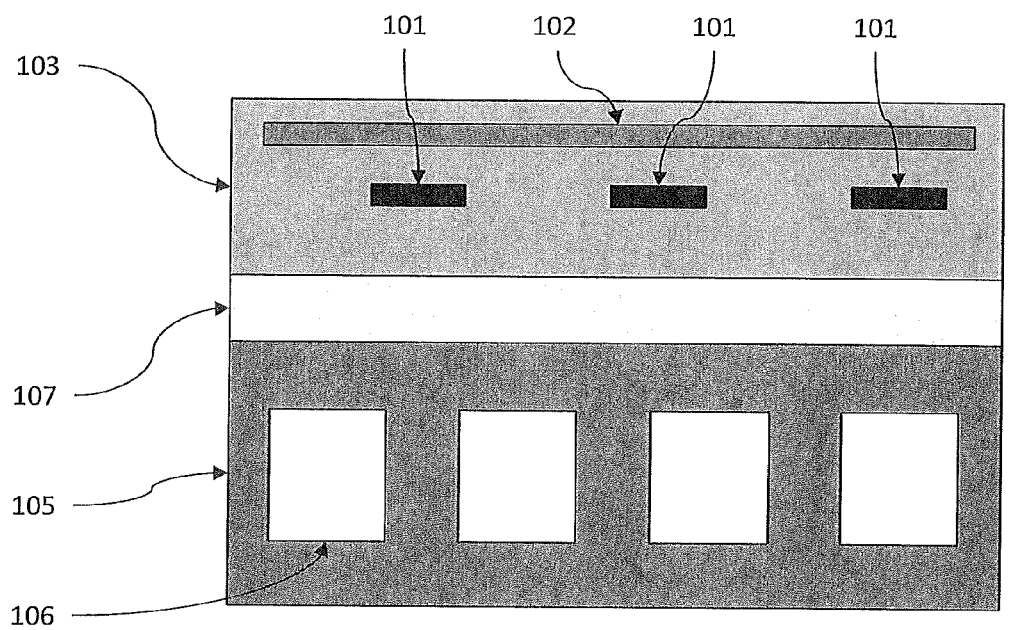
FIG. 1 is a schematic cross-sectional view of a substrate support assembly in which a heating plate with an array of planar heater zones is incorporated, the substrate support assembly also comprising an electrostatic chuck (ESC).

Radial and azimuthal substrate temperature control in a semiconductor processing apparatus to achieve desired critical dimension (CD) uniformity on the substrate is becoming more demanding. Even a small variation of temperature may affect CD to an unacceptable degree, especially as CD approaches sub-100 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate holder, a fluid-cooled heat sink (hereafter referred to as cooling plate) and a plurality of concentric planar heater zones to realize step by step and radial temperature control. Typically, the cooling plate is maintained between 0° C. and 30° C. The heaters are located on the cooling plate with a layer of thermal insulator in between. The heaters can maintain the support surface of the substrate support assembly at temperatures about 0° C. to 80° C. above the cooling plate temperature. By changing the heater power within the plurality of planar heater zones, the substrate support temperature profile can be changed. Further, the mean substrate support temperature can be changed step by step within the operating range of 0 to 80° C. above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating the cooling elements in the chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

In light of the complex nature of temperature control, it would be advantageous to incorporate multiple independently controllable planar heater zones in the substrate support assembly to enable the apparatus to actively create and maintain the desired spatial and temporal temperature profile, and to compensate for other adverse factors that affect CD uniformity.

Described herein is a heating plate for a substrate support assembly in a semiconductor processing apparatus, wherein the heating plate has multiple independently controllable planar heater zones that include heater elements made from a conductor-insulator composite. This heating plate comprises a scalable multiplexing layout scheme of the planar heater zones, power supply lines and power return lines (collectively, power lines). By tuning the power of the planar heater zones, the temperature profile during processing can be shaped both radially and azimuthally. More details are disclosed in commonly-owned U.S. patent application Ser. No. 12/582,991, the disclosure of which is hereby incorporated by reference. Although this heating plate is primarily described for a plasma processing apparatus, this heating plate can also be used in other semiconductor processing apparatuses that do not use plasma.

The planar heater zones in this heating plate are preferably arranged in a defined pattern, for example, a rectangular grid, a hexagonal grid, a polar array, concentric rings or any desired pattern. Each planar heater zone may be of any suitable size and may have one or more heater elements. When a planar heater zone is powered, all heater elements therein are powered; when a planar heater zone is not powered, all heater elements therein are not powered. To minimize the number of electrical connections, power supply lines and power return lines are arranged such that each power supply line is connected to a different group of planar heater zones and each power return line is connected to a different group of planar heater zones, each planar heater zone being in one of the groups connected to a particular power supply line and one of the groups connected to a particular power return line. No two planar heater zones are connected to the same pair of power supply and power return lines. A planar heater zone can be activated by directing electrical current through a pair of power supply line and power return line to which this particular planar heater zone is connected. The power of the heater elements is preferably smaller than 20 W, more preferably 5 to 10 W. In one embodiment, each planar heater zone is not larger than four device dies being manufactured on a semiconductor substrate, or not larger than two device dies being manufactured on a semiconductor substrate, or not larger than one device die being manufactured on a semiconductor substrate, or 16 to 100 cm$^2$, or 1 to 15 cm$^2$, or 2 to 3 cm$^2$, or 0.1 to 1 cm$^2$ in area to correspond to the device dies on the substrate. The heating plate can include any suitable number of planar heater zones, such as 100 to 400 planar heater zones. The thickness of the heater elements may range from 2 micrometers to 1 millimeter, preferably 5-80 micrometers. To allow space between planar heater zones and/or power supply and power return lines, the total area of the planar heater zones may be up to 99% of the area of the upper surface of the substrate support assembly, e.g. 50-99% of the area. The power supply lines or the power return lines may be arranged in gaps ranging from 1 to 10 mm between the planar heater zones, or in separate planes separated from the planar heater zones plane by electrically insulating layers. The power supply lines and the power return lines are preferably made as wide as the space allows, in order to carry large current and reduce Joule heating. In one embodiment, in which the power lines are in the same plane as the planar heater zones, the width of the power lines is preferably between 0.3 mm and 2 mm. In another embodiment, in which the power lines are on different planes than the planar heater zones, the width of the power lines can be as large as the planar heater zones, e.g. for a 300 mm chuck, the width can be 1 to 2 inches. Preferably, the materials of the power supply lines and power return lines are materials with low resistivity, such as Cu, Al, W, Inconel® or Mo.

A conventional resistive heater element typically comprises a serpentine trace made of electrical conductors with low resistivity, such as Al, Cu, W, Inconel® and Mo. Under a fixed input voltage V, the heating power P of the resistive heater element is $V^2/R$, wherein R is the electrical resistance thereof. R can be expressed as $(\rho \cdot L)/(W \cdot T)$, wherein $\rho$ is the electrical resistivity of the material the serpentine trace is made of; L, W and T are the total length, width and thickness of the serpentine trace, respectively. Geometrical factors L, W and T of the serpentine trace are constrained by the physical size of the planar heater zone in which the resistive heater element is enclosed. L has an upper limit due to available area in the planar heater zone; W and T have a lower limit due to fabrication techniques. Thus, R has an upper limit and P has a lower limit. It is increasingly difficult to meet the power requirement (preferably smaller than 20 W, more preferably 5 to 10 W) as the planar heater zones shrink in size (e.g. 5 mm by 5 mm or smaller). Increasing the electrical resistivity p, as described hereinbelow, can alleviate this problem.

FIG. 1 shows a substrate support assembly comprising one embodiment of the heating plate having an electrically insulating layer 103. The layer 103 may have one or more layers made of a polymer material, an inorganic material, a ceramic such as silicon oxide, alumina, yttria, aluminum nitride or other suitable material. The substrate support assembly further comprises (a) at least one ESC (electrostatic clamping) electrode 102 (e.g. monopolar or bipolar) embedded in the layer 103 to electrostatically clamp a substrate to the surface of the layer 103 with a DC voltage, (b) a thermal barrier layer 107, (c) a cooling plate 105 containing channels 106 for coolant flow. The power supply lines and power return lines are not shown for clarity.

Figure 2:
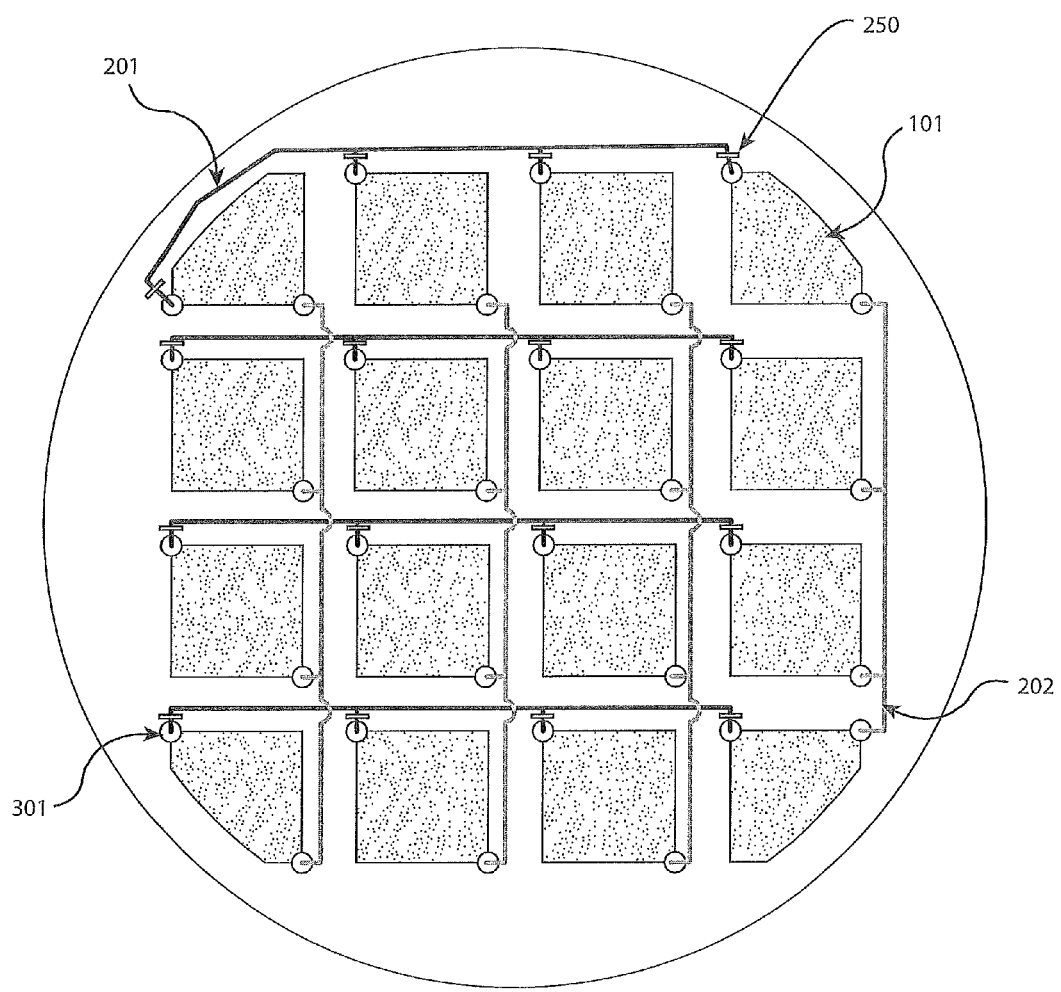
FIG. 2 illustrates the electrical connection of power supply lines and power return lines to an array of planar heater zones in a heating plate which can be incorporated in a substrate support assembly.

As shown in FIG. 2, each of the planar heater zones 101 is connected to one of the power supply lines 201 and one of the power return lines 202. No two planar heater zones 101 share the same pair of power supply 201 and power return 202 lines. By suitable electrical switching arrangements, it is possible to connect a pair of power supply line 201 and power return line 202 to a power supply (not shown), whereby only the planar heater zone connected to this pair of power lines is powered. The time-averaged heating power of each planar heater zone can be individually tuned by time-domain multiplexing. In order to prevent crosstalk between different heater zones, a rectifier 250 (e.g. a diode) may be serially connected between each heater zone and the power supply lines connected thereto (as shown in FIG. 2), or between each heater zone and the power return lines connected thereto (not shown). The rectifier can be physically located in the heating plate or any suitable location. Alternatively, any current blocking arrangement such as solid state switches can be used to prevent crosstalk.

Each planar heater zone 101 comprises at least one heater element made of an insulator-conductor composite. In one embodiment, the insulator-conductor composite comprises one or more insulator selected from the group consisting of $Al_2O_3$, $SiO_2$, $Si_3N_4$, AlN and a mixture thereof, and one or more conductor selected from the group consisting of Al, Cu, Mo, W, Au, Ag, Pt, Pd, C, $MoSi_2$, WC, SiC and a mixture thereof. The insulator-conductor composite can be made by mixing powders (preferably having particle sizes from 0.2 to 10 microns) of an insulator and a conductor with a suitable liquid (e.g. methanol, ethanol, acetone, isopropyl alcohol, water, mineral oil, or a mixture thereof) into a slurry, and sintering the slurry. In a preferred embodiment, the insulator-conductor composite comprises up to 30 wt % of $Al_2O_3$ and balance of W.

The layer 103 of the heating plate is preferably made of ceramic. The heating plate can be made by an exemplary method comprising: pressing a mixture of ceramic powder, binder and liquid into sheets; drying the sheets; forming vias in the sheets by punching holes in the sheets; forming power supply lines and power return lines on the sheets by screen printing a slurry of conducting powder (e.g. W, WC, doped SiC or MoSi$_2$), pressing a precut metal foil, spraying a slurry of conducting powder, or any other suitable technique; forming heater elements by screen printing or spraying a slurry of insulator and conductor powders; aligning the sheets; bonding the sheets by sintering to form the layer 103; filling the vias with a slurry of conducting powder. The sheets can be about 0.3 mm in thickness.

Figure 3:
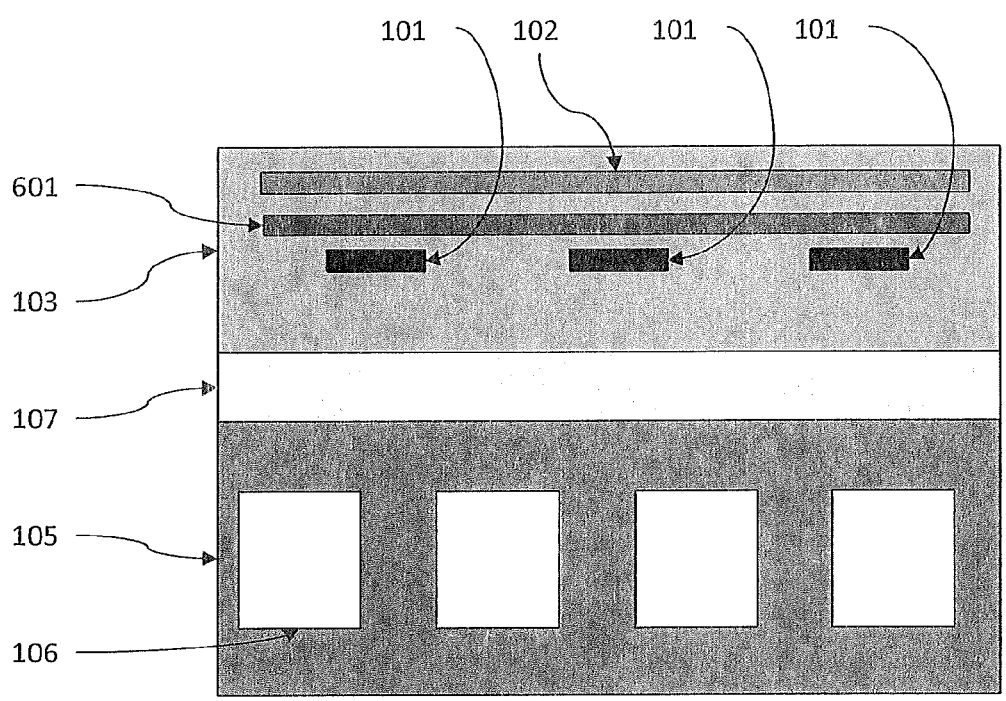
FIG. 3 is a schematic cross-sectional view of a substrate support assembly in which a heating plate is incorporated, the substrate support assembly further including a primary heater layer.

FIG. 3 shows the substrate support assembly of FIG. 1, further comprising the primary heater layer 601. Preferably, the primary heaters 601 are individually controlled high-power heaters. The power of the primary heaters is between 100 and 10000 W, preferably, between 1000 and 5000 W. The primary heaters may be arranged as a rectangular grid, concentric annular zones, radial zone or combination of annular zones and radial zones. The primary heaters may be used for changing the mean temperature, tuning the radial temperature profile, or step-by-step temperature control on the substrate. The primary heaters may be located above or below the heater zones of the heating plate.

Figure 4:
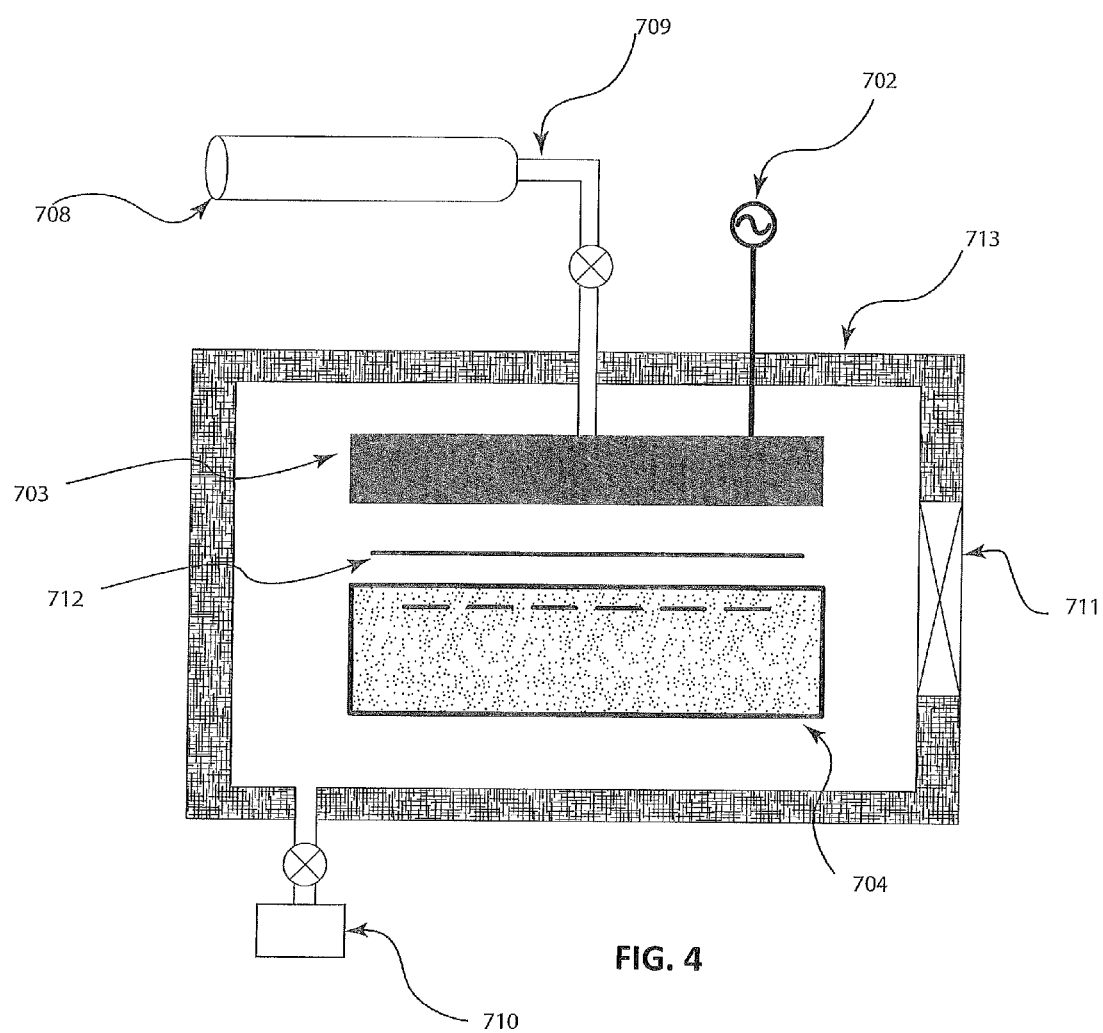
FIG. 4 is a schematic of an exemplary plasma processing chamber, which can include a substrate support assembly with the heating plate described herein.

As an overview of how a plasma processing chamber operates, FIG. 4 shows a schematic of a plasma processing chamber comprising a chamber 713 in which an upper showerhead electrode 703 and a substrate support assembly 704 are disposed. A substrate 712 is loaded through a loading port 711 onto the substrate support assembly 704. A gas line 709 supplies process gas to the upper showerhead electrode 703 which delivers the process gas into the chamber. A gas source 708 (e.g. a mass flow controller supplying a suitable gas mixture) is connected to the gas line 709. A RF power source 702 is connected to the upper showerhead electrode 703. In operation, the chamber is evacuated by a vacuum pump 710 and the RF power is capacitively coupled between the upper showerhead electrode 703 and a lower electrode in the substrate support assembly 704 to energize the process gas into a plasma in the space between the substrate 712 and the upper showerhead electrode 703. The plasma can be used to etch device die features into layers on the substrate 712. The substrate support assembly 704 may have heaters incorporated therein. As described above, it should be appreciated that while the detailed design of the plasma processing chamber may vary, RF power is coupled to the plasma through the substrate support assembly 704.

Examples of suitable insulating and conductive material for use in manufacture of the substrate support assembly are disclosed in commonly assigned U.S. Pat. No. 6,483,690, the disclosure of which is hereby incorporated by reference.

While a heating plate, methods of manufacturing the heating plate, and a substrate support assembly comprising the heating plate have been described in detail with reference to specific embodiments thereof, it will be apparent to those skilled in the art that various changes and modifications can be made, and equivalents employed, without departing from the scope of the appended claims.

I claim:

1. A method of making a heating plate comprising planar independently controllable heater zones laterally distributed across an electrically insulating layer configured to form part of a substrate support assembly used to support a semiconductor substrate in a semiconductor processing apparatus, each heater zone comprising one or more heater elements made of an insulator-conductor composite, the method comprising: mixing powders of an insulator and a conductor with a liquid into a slurry, and sintering the slurry wherein the total number of the power supply lines and the power return lines is equal to or less than the total number of the planar heater zones.

2. The method of claim 1, wherein the liquid is selected from the group consisting of methanol, ethanol, acetone, isopropyl alcohol, water, mineral oil and a mixture thereof.

3. The method of claim 1, wherein the powders have particle sizes from 0.2 to 10 microns.

4. The method of claim 1, wherein the insulator-conductor composite comprises one or more insulator selected from the group consisting of $Al_2O_3$, $SiO_2$, $Si_3N_4$, AlN and a mixture thereof, and one or more conductor selected from the group consisting of Al, Cu, Mo, W, Au, Ag, Pt, Pd, C, $MoSi_2$, WC, SiC and a mixture thereof.

5. The method of claim 4, wherein the insulator-conductor composite comprises up to 30 wt % of $Al_2O_3$ and balance of W.

6. The method of claim 1, wherein the heating plate includes 100 to 400 planar heater zones.

7. The method of claim 1, wherein the electrically insulating layer comprises a polymer material, a ceramic material, a fiberglass composite, or a combination thereof.

8. The method of claim 1, wherein a total area of the planar heater zones is from 50% to 99% of an upper surface of the heating plate.

9. The method of claim 1, wherein the planar heater zones are arranged in a rectangular grid and the planar heater zones are separated from each other by gaps at least 1 millimeter in width and at most 10 millimeters in width.

10. The method of claim 1, further comprising arranging at least one primary heater layer above or below and the planar heater zones of the heating plate, wherein the primary heater layer is electrically insulated from the planar heater zones, the power supply lines, and the power return lines of the heating plate; the primary heater layer includes at least one heater which provides mean temperature control of the semiconductor substrate; the planar heater zones provide radial and azimuthal temperature profile control of the semiconductor substrate, during processing thereof.

11. The method of claim 10, wherein the primary heater layer includes two or more heaters.

12. A method for manufacturing a heating plate comprising an electrically insulating layer, planar heater zones comprising at least first, second, third and fourth planar heater zones, each comprising one or more heater element made of an insulator-conductor composite, the planar heater zones laterally distributed across the electrically insulating layer, power supply lines comprising at least a first electrically conductive power supply line electrically connected to the first and second planar heater zones and a second electrically conductive power supply line electrically connected to the third and fourth planar heater zones, power return lines comprising at least a first electrically conductive power return line electrically connected to the first and third planar heater zones and a second electrically conductive power return line electrically connected to the second and fourth planar heater zones, comprising:

pressing a mixture of ceramic powder, binder and liquid into sheets;
drying the sheets;
forming vias in the sheets by punching holes therein;
forming the power supply lines and power return lines on the sheets;
forming heater elements by screen printing or spraying a slurry of insulator and conductor powders;
aligning the sheets;

bonding the sheets by sintering to form the electrically insulating layer;

filling the vias with a slurry of conducting powder.

13. The method of claim 12, wherein the power supply lines and power return lines are formed by screen printing a slurry of conducting powder, pressing a precut metal foil, or spraying a slurry of conducting powder.

14. A method for plasma processing semiconductor substrates in a plasma processing chamber containing a substrate support assembly comprising an electrostatic chuck (ESC) including at least one electrostatic clamping electrode configured to electrostatically clamp a semiconductor substrate on the substrate support assembly, a heating plate comprising an electrically insulating layer, planar heater zones comprising at least first, second, third and fourth planar heater zones, each comprising one or more heater element made of an insulator-conductor composite, the planar heater zones laterally distributed across the electrically insulating layer and operable to tune a spatial temperature profile on the semiconductor substrate, power supply lines comprising at least a first electrically conductive power supply line electrically connected to the first and second planar heater zones and a second electrically conductive power supply line electrically connected to the third and fourth planar heater zones, power return lines comprising at least a first electrically conductive power return line electrically connected to the first and third planar heater zones and a second electrically conductive power return line electrically connected to the second and fourth planar heater zones, and a cooling plate attached to a lower side of the heating plate by a thermal barrier layer, comprising:

(a) loading a semiconductor substrate into the processing chamber and positioning the semiconductor substrate on the substrate support assembly;

(b) determining a temperature profile that compensates for processing conditions affecting critical dimension (CD) uniformity;

(c) heating the semiconductor substrate to conform to the temperature profile using the substrate support assembly;

(d) igniting plasma and processing the semiconductor substrate while controlling the temperature profile by independently controlled heating of the planar heater zones;

(e) unloading the semiconductor substrate from the processing chamber and repeating steps (a)-(e) with a different semiconductor substrate.

\* \* \* \* \*